United States Patent [19]

Inbar

[11] Patent Number: 5,699,204
[45] Date of Patent: Dec. 16, 1997

[54] METHOD AND APPARATUS FOR THE COHERENT DEMODULATION OF AN AMPLIFIED MODULATED CARRIER USING A DUAL TRACK AND HOLD AMPLIFIER AND THE APPLICATION OF SAID METHOD AND APPARATUS TO MEASUREMENT OF MAGNETIC MEDIA PERFORMANCE

[75] Inventor: Michael Inbar, Santa Barbara, Calif.

[73] Assignee: Phase Metrics, San Diego, Calif.

[21] Appl. No.: 555,362

[22] Filed: Nov. 8, 1995

[51] Int. Cl.$^6$ .................. G11B 27/36; G11B 5/02; G11B 5/09

[52] U.S. Cl. ................... 360/31; 360/29; 360/51

[58] Field of Search .................. 360/46, 51, 53, 360/28–31; 324/113, 112, 118, 210

[56] References Cited

U.S. PATENT DOCUMENTS

| | | | |
|---|---|---|---|
| 5,006,819 | 4/1991 | Buchan et al. | 360/51 |
| 5,184,343 | 2/1993 | Johann et al. | 369/116 |

*Primary Examiner*—Aristotelis M. Psitos
*Assistant Examiner*—Regina Y. Neal
*Attorney, Agent, or Firm*—Blakely Sokoloff Taylor & Zafman

[57] ABSTRACT

An apparatus and method for demodulating an amplitude modulated read signal generated by a magnetic head of a hard disk drive. The apparatus includes a pair of serially connected track and hold circuits that receive the read signal. The track or hold state of each circuit is controlled by a phase lock loop circuit which also receives the read signal. The first track and hold circuit initially tracks the read signal to a peak value. The circuit then switches to a hold state and provides a constant output signal that corresponds to the peak voltage of the read signal. While the first track and hold circuit is in the hold state, the second track and hold circuit is in a tracking state. The second track and hold circuit tracks the output of the first circuit. Because the output of the first circuit is a constant value, the second circuit also provides a constant output signal in the tracking state. The first circuit is switched back to the tracking state to again track the amplitude of the read signal, and the second circuit is switched to the hold state. The process is repeated to create a "stepped" demodulated signal. The output signals are compared to a threshold value to detect bit errors in the signal. The constant output signals provide additional energy to the detection circuit to minimize the number of false error signals from the comparator circuit.

19 Claims, 3 Drawing Sheets

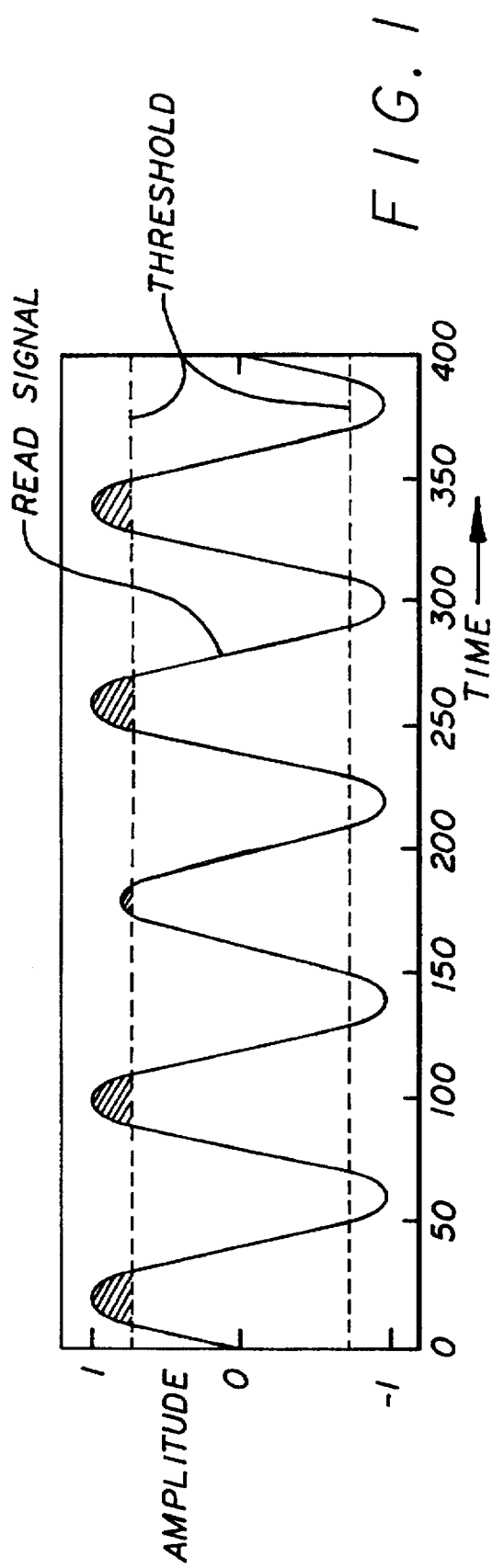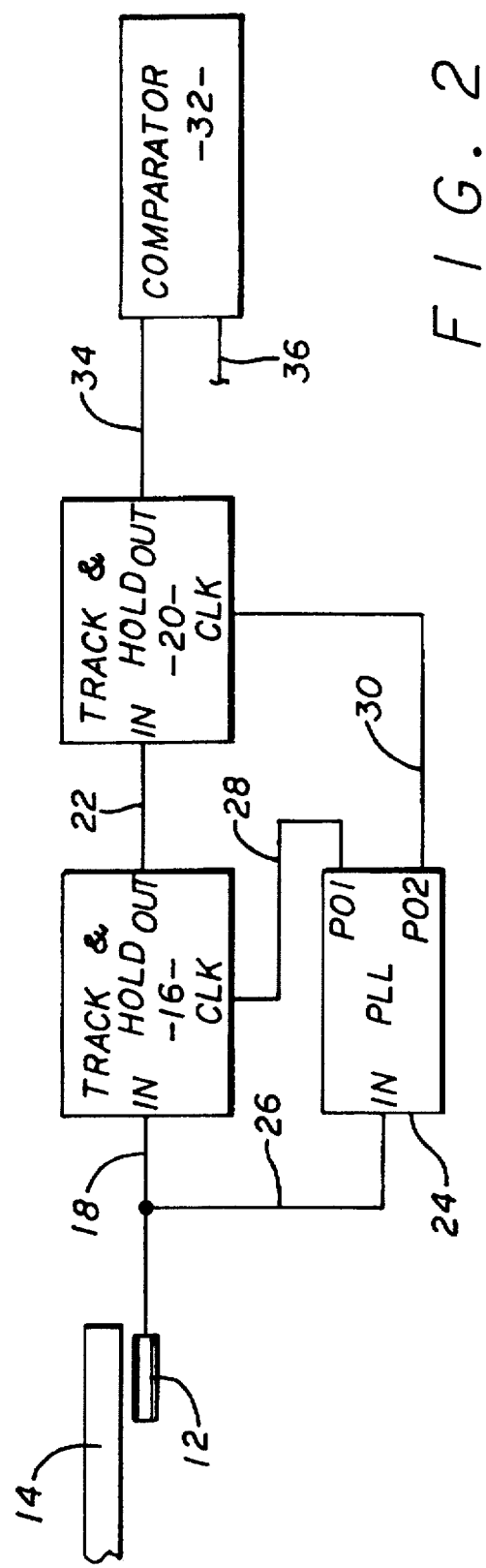

METHOD AND APPARATUS FOR THE COHERENT DEMODULATION OF AN AMPLIFIED MODULATED CARRIER USING A DUAL TRACK AND HOLD AMPLIFIER AND THE APPLICATION OF SAID METHOD AND APPARATUS TO MEASUREMENT OF MAGNETIC MEDIA PERFORMANCE

BACKGROUND OF THE INVENTION

1. Field of the Invention

The present invention relates to a test apparatus that demodulates an amplitude modulated signal generated by a magnetic head of a hard disk drive.

2. Description of Related Art

Hard disk drives contain a magnetic disk(s) that magnetically stores information. Materials and processes used in manufacturing the magnetic disk may introduce defects and substandard magnetic characteristic in all or portions of the disk. For this reason, the disks are typically tested before being assembled to the disk drive unit.

Magnetic disk are typically tested by initially writing data onto the disk and then reading back the data. The data is written and read by a magnetic head which generates a read signal that corresponds to the magnetic field of the disk.

FIG. 1 shows a typical read signal generated by a magnetic head of a disk certification tester. The read signal is an alternating current with an amplitude that varies over time. Disk defects are typically detected by analyzing a group of voltage peaks on the read signal. The tester generates a threshold value for each group and then compares each peak with the threshold. If a voltage peak is below the threshold value the tester flags that area of the disk as having a defect or error.

The voltage peaks are compared to the threshold value with detection and comparator circuitry which require a finite amount of energy to operate properly. The area shaded in FIG. 1 defines the amount of energy that is provided to the comparator circuit to compare a valid peak with the threshold value. The size of the shaded area is clearly a function of the frequency of the underlying wave form. Thus, the minimum detection threshold is a function of the signal frequency. Yet, the quality criteria of the magnetic surface requires that the detection threshold be frequency independent. For example, a point on the surface is defective if the read back amplitude falls by N% relative to neighboring points. Where N is independent of the written frequency. Hence, with increasing frequency more "good points" will be called defective.

SUMMARY OF THE INVENTION

The present invention is an apparatus and method for demodulating an amplitude modulated read signal generated by a magnetic head of a hard disk drive. The apparatus includes a pair of serially connected track and hold circuits that receive the read signal. The track or hold state of each circuit is controlled by a phase lock loop circuit which also receives the read signal. The first track and hold circuit initially tracks the read signal to a peak value. The circuit then switches to a hold state and provides a constant output signal that corresponds to the peak voltage of the read signal. While the first track and hold circuit is in the hold state, the second track and hold circuit is in a tracking state. The second track and hold circuit tracks the output of the first circuit. Because the output of the first circuit is a constant value, the second circuit also provides a constant output signal in the tracking state. The first circuit is switched back to the tracking state to again track the amplitude of the read signal, and the second circuit is switched to the hold state. The process is repeated to create a "stepped" demodulated signal. The output signals are compared to a threshold value to detect errors in the signal. The constant output signals provide additional energy to the comparator circuit to minimize the number of false error signals from the circuit.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a graph showing a read signal generated by a magnetic head used to test a magnetic disk of a hard disk drive of a prior art tester;

FIG. 2 is a schematic of a demodulation circuit of the present invention;

DETAILED DESCRIPTION OF THE INVENTION

Figure 3:
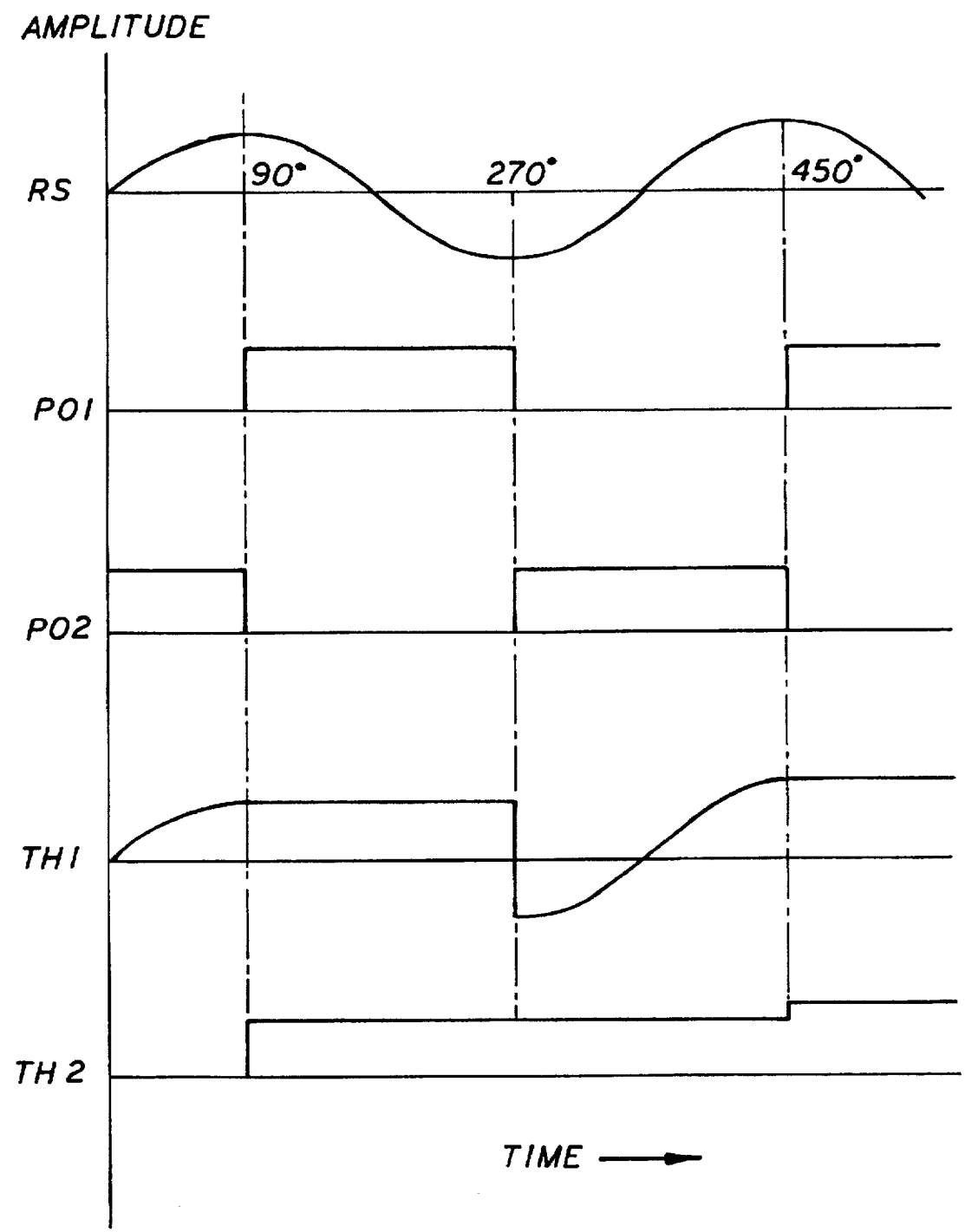
FIG. 3 is a timing diagram of the circuit.

Referring to the drawings more particularly by reference numbers, FIG. 2 shows a demodulation circuit 10 of the present invention. The circuit 10 is coupled to a magnetic head 12 that magnetizes and senses the magnetic field of a magnetic disk 14. The demodulation circuit 10 is typically used to detect single or multiple bit errors on the disk 14. The magnetic disk 14 is typically tested by initially writing an alternating current ("AC") signal onto the disk 14 with the magnetic head 12. The head 12 then reads the signal back from the disk 14. When reading the magnetic disk 14, the head 12 generates a read signal that corresponds to the magnetic field of the disk 14. Defects, manufacturing tolerances and other factors may vary the amplitude of the signal. The read signal therefore becomes an amplitude modulated signal. The demodulation circuit 10 of the present invention demodulates the signal so that bit errors can be detected on the disk 14. Although a demodulation circuit 10 used to demodulate a read signal of a hard disk drive magnetic head is shown and described, it is to be understood that the circuit 10 can be used to demodulate any amplitude modulated carrier signal.

The read signal generated by the magnetic head 12 is provided to an input of a first track and hold circuit 16 on line 18. The first track and hold circuit 16 has an output that is serially connected to an input of a second track and hold circuit 20 on line 22. The track and hold circuits 16 and 20 each operate in one of two states, tracking or hold. In the tracking state the amplitude of a signal provided to the input pin is tracked, typically by amplifying the signal and then charging a capacitor (not shown) with the amplified signal. The output of the track and hold circuit is tied to the capacitor so that the output of the circuit corresponds to the voltage across the capacitor.

In the hold state, the track and hold circuits decouple the tracking capacitor from the input pin. In this state, the output of the track and hold circuit is a constant signal that corresponds to the voltage of the charged capacitor. The track and hold pins are switched between the hold and track states by input signals to the clock ("CLK") pins of the circuits. In the preferred embodiment, the track and hold circuits are integrated circuits produced by Analog Devices under the part designation AD 9101.

The read signal is also provided to a phase lock loop ("PLL") circuit 24 on line 26. The phase lock loop circuit 24 has a first output PO1 connected to the CLK pin of the first track and hold circuit 16 by line 28, and a second output PO2 connected to the CLK pin of the second track and hold circuit 20 by line 30. The PLL circuit 24 provides output control signals to change the state of the track and hold circuits 16 and 20, so that one circuit is tracking while the other circuit is in a hold state. The PLL 24 provides the control signals so that the track and hold circuits 16 and 20 are 180° out of phase. To provide this function the second output PO2 is typically an inverted signal of the first output PO1. In the preferred embodiment, the phase lock loop circuit 24 includes integrated circuits produced by Quality Semiconductors under the part designation Q55917T-132T and Altera Corporation under the part designation EPM 7032-6.

FIG. 3 shows a timing diagram of the phase lock loop circuit 24. The read signal RS provided is an AC signal with a maximum peak located at a 90° phase angle and a minimum peak located at a 270° phase angle. When the read signal RS reaches the 90° phase angle the PLL circuit 24 generates an active first output signal PO1. The active first output signal PO1 switches the first track and hold circuit 16 from a tracking state to a hold state. The PO2 output signal is de-activated so that the second track and hold circuit 20 is switched to the tracking state.

When the read signal RS reaches the 270° phase angle, the PLL circuit 24 de-activates the first output signal PO1 and drives the second output signal PO2 active. Driving the second output signal PO2 active switches the second track and hold circuit 20 from a tracking state to a hold state. The de-activated first output signal PO1 changes the first track and hold circuit 16 from a hold state to a tracking state.

Referring to FIG. 2, the output of the second track and hold circuit 20 is connected to a threshold comparator circuit 32 by line 34. The comparator circuit 32 compares each output signal of the second track and hold circuit 20 with a threshold value provided on line 36. If the output signal is below the threshold value, the comparator circuit 32 provides a bit error signal which indicates that there is a bit error on the disk 14. The threshold value is typically a percentage of an average of n number of peaks detected from the read signal. By way of example, the threshold value may be 99% of the average voltage of 5 adjacent maximum peaks of the read signal.

Referring to FIG. 3, in operation, the magnetic head 12 provides the read signal RS to the PLL circuit 24 and the first track and hold circuit 16. The first output PO1 of the PLL circuit 24 is inactive. The second output PO2 is active. The first track and hold circuit 16 is in a tracking mode. The second track and hold circuit 20 is in a hold state. The output signal TH1 of the first track and hold circuit 16 follows the amplitude of the read signal RS. Because the second track and hold circuit 20 is in a hold state, the output TH2 of circuit 20 corresponds to the voltage across the internal capacitor. In the hold state the internal capacitor is decoupled from the input of the circuit 20 such that the output signal TH2 does not increase with the rise in the read RS and TH1 signals.

When the read signal reaches the 90° phase angle, the PLL circuit 24 activates the output signal PO1 and de-activates PO2. The control signals PO1 and PO2 switch the first track and hold circuit 16 to a hold state, and the second track and hold circuit 20 to a tracking state. The first track and hold circuit 16 provides a constant output signal TH1 which corresponds to the peak amplitude of the read signal RS. The second track and hold circuit 20 now tracks the output of the first circuit 16. The output of the second circuit 20 tracks and provides the same constant output signal TH2 as the output TH1 of the first circuit 16.

When the read signal reaches the 270° phase angle the PLL circuit 24 de-activates the output signal PO1 and activates the output signal PO2. The first track and hold circuit 16 switches to a tracking mode, and the second track and hold circuit 20 switches to a hold state. The output TH1 of the first circuit 16 follows the amplitude of the read signal RS. The second circuit 20 provides a constant output signal TH2 which corresponds to the amplitude of the initial output signal of TH1.

In this example, the amplitude of the second maximum peak is greater than the first maximum peak. The first track and hold circuit 16 follows the read signal RS to the amplitude of the second peak. When the read signal reaches 450° (90°) the PLL circuit 24 changes the track and hold circuits, so that the first circuit 16 is holding and the second circuit 20 is tracking. The output TH2 of the second circuit 20 steps to the amplitude of the second peak that was tracked by the first circuit 16.

Figure 4:
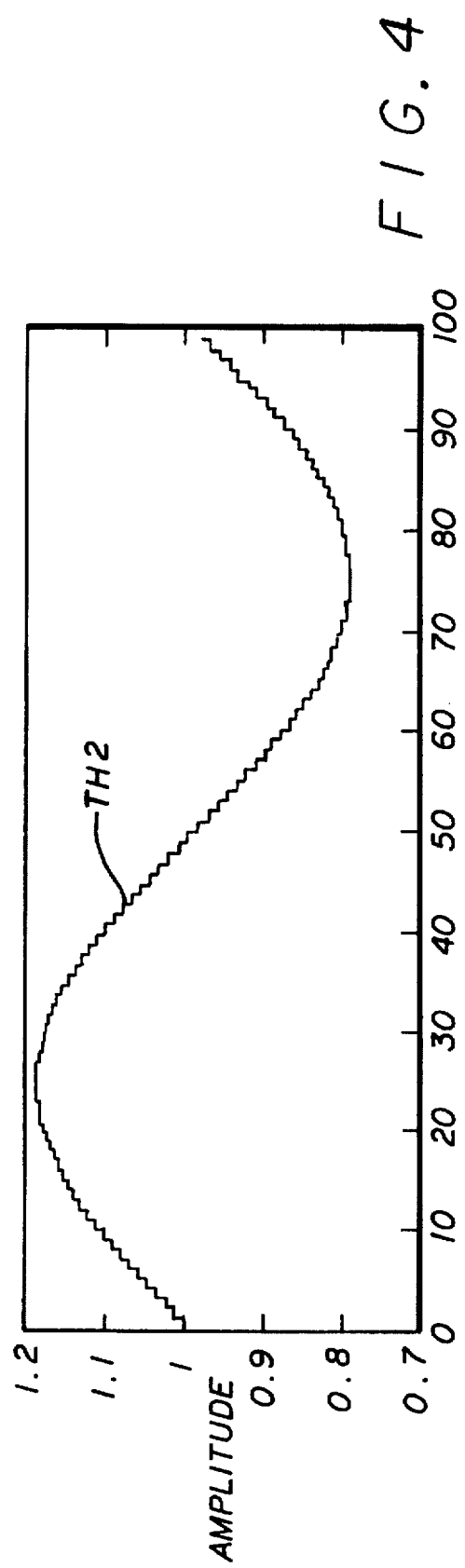
FIG. 4 is a graph showing a demodulated read signal.
Figure 5:
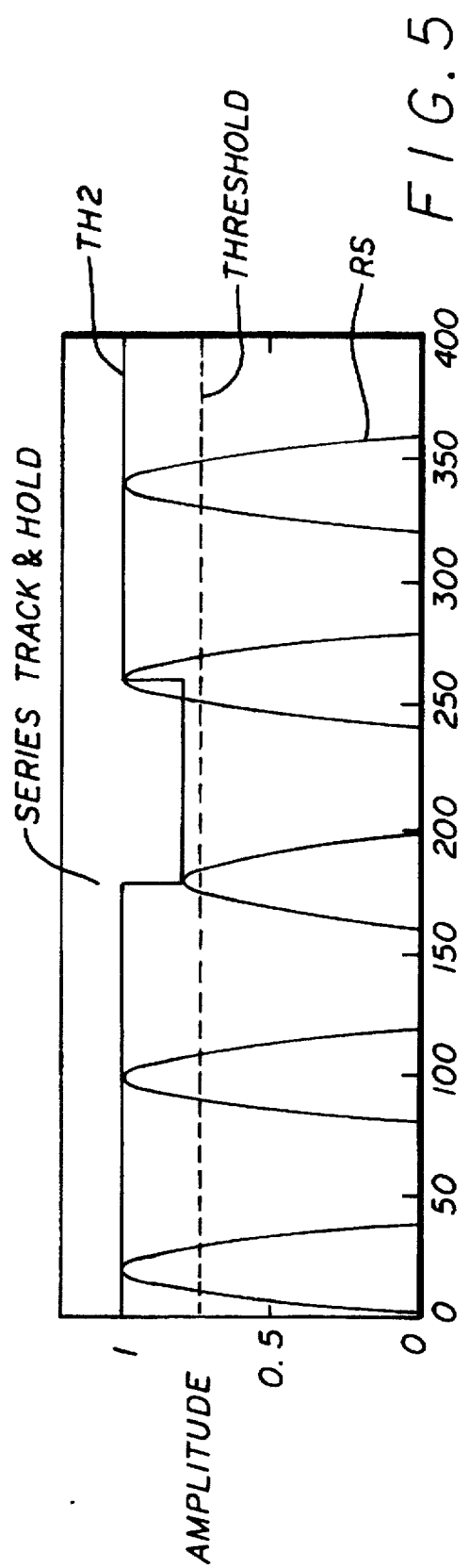
FIG. 5 is an enlarged view of the demodulated read signal with the modulated read signal provided by a magnetic head.

As shown in FIGS. 4 and 5, the process is repeated to generate a stepped, amplitude demodulated, read signal. Each stepped output provides an amount of energy to the comparator circuit 32 that is greater than detectors in the prior art. Therefore the demodulation circuit 10 generates less false bit error signals than circuits in the prior art. The series track and hold circuits also minimize errors created by any phase shift produced by the PLL circuit. It has been found that any phase shift will only vary the amplitude of the demodulated signal TH2.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A test apparatus for demodulating a read signal generated by a magnetic head that senses a magnetic field of a magnetic disk, wherein the read signal has a varying amplitude, comprising:

a first track and hold circuit which provides an output signal that tracks the amplitude of the read signal when in a tracking state, and provides a constant first output signal approximately equal to the amplitude of the read signal when said first track and hold circuit switches to a hold state;

a second track and hold circuit that is in series with said first track and hold circuit, said second track and hold circuit provides an output signal that tracks the amplitude of said constant first output signal when in a tracking state, and switches to a hold state to provide a second output signal approximately equal to said constant first output signal, said second track and hold circuit switches between said tracking and hold states at a phase that is different from when said first track and hold circuit switches between said tracking and hold states; and, a control circuit that switches the states of said first and second track and hold circuits.

2. The apparatus as recited in claim 1, wherein said second track and hold circuit switches between said tracking and hold states 180° out of phase from when said first track and hold circuit switches between said tracking and hold states.

3. The apparatus as recited in claim 1, wherein said control circuit is a phase lock loop circuit which has an input that receives the read signal, a first output which provides a first control signal to switch said first track and hold circuit between said tracking and hold states, and a second output which provides a second control signal to switch said second track and hold circuit between said tracking and hold states.

4. The apparatus as recited in claim 1, wherein said second control signal is 180° out of phase with said first control signal.

5. A test apparatus for demodulating a read signal generated by a magnetic head that senses a magnetic field of a magnetic disk, wherein the read signal has a plurality of peaks which have a varying amplitude, comprising:

track and hold means for providing a continuous DC output signal that tracks the varying amplitude of the peaks of the read signal, wherein said track and hold means include a first track and hold circuit which provides an output signal that tracks the amplitude of the read signal when in a tracking state, and provides a constant first output signal approximately equal to the amplitude of the read signal when said first track and hold circuit, said second track and hold circuit provides an output signal that tracks the amplitude of said constant first output signal when in a tracking state, and switches to a hold state to provide said continuous DC output signal approximately equal to said constant first output signal, said second track and hold circuit switches between said tracking and hold states at a phase that is different from when said first track and hold circuit switches between said tracking and hold states and, a control circuit that switches the states of said first and second track and hold circuits;

a comparator which compares said continuous DC output signal with a threshold signal to determine whether said continuous DC output signal exceeds said threshold signal.

6. The apparatus as recited in claim 5, wherein said control means is a phase lock loop circuit which has an input that receives the read signal, a first output which provides a first control signal to switch said first track and hold means between said tracking and hold states, and a second output which provides a second control signal to switch said second track and hold means between said tracking and hold states.

7. The apparatus as recited in claim 5, wherein said second control signal is 180° out of phase with said first control signal.

8. The apparatus as recited in claim 5, wherein said control means is a phase lock loop circuit which has an input that receives the signal, a first output which provides a first control signal to switch said first track and hold means between said tracking and hold states, and a second output which provides a second control signal to switch said second track and hold means between said tracking and hold states.

9. The apparatus as recited in claim 5, wherein said second control signal is 180° out of phase with said first control signal.

10. A method for demodulating a read signal generated by a magnetic head that senses a magnetic field of a magnetic disk, wherein the read signal has a varying amplitude, comprising the steps of:

a) tracking the amplitude of the read signal to a peak amplitude with a first track and hold circuit;

b) providing a first constant output signal that corresponds to the peak amplitude of the read signal;

c) tracking said first constant output signal with a second track and hold circuit;

d) tracking the amplitude of the read signal with said first track and hold circuit while providing a second constant output signal with said second track and hold circuit that corresponds to said first constant output signal; and, e) repeating steps (a)–(d).

11. The method as recited in claim 10, wherein step (b) occurs 90° out of phase from step (a), step (c) occurs 90° out of phase from step (b), and step (d) occurs 90° out of phase from step (c).

12. An apparatus for demodulating an amplitude modulated signal that has a varying amplitude, comprising:

a first track and hold circuit which provides an output signal that tracks the amplitude of the amplitude modulated signal when in a tracking state, and provides a constant first output signal approximately equal to the amplitude of the amplitude modulated signal when said first track and hold circuit switches to a hold state;

a second track and hold circuit that is in series with said first track and hold circuit, said second track and hold circuit provides an output signal that tracks the amplitude of said constant first output signal when in a tracking state, and switches to a hold state to provide a second output signal approximately equal to said constant first output signal, said second track and hold circuit switches between said tracking and hold states at a phase that is different from when said first track and hold circuit switches between said tracking and hold states; and, a control circuit that switches the states of said first and second track and hold circuits.

13. The apparatus as recited in claim 12, wherein said second track and hold circuit switches between said tracking and hold states 180° out of phase from when said first track and hold circuit switches between said tracking and hold states.

14. The apparatus as recited in claim 12, wherein said control circuit is a phase lock loop circuit which has an input that receives the amplitude modulated signal, a first output which provides a first control signal to switch said first track and hold circuit between said tracking and hold states, and a second output which provides a second control signal to switch said second track and hold circuit between said tracking and hold states.

15. The apparatus as recited in claim 12, wherein said second control signal is 180° out of phase with said first control signal.

16. A test apparatus for demodulating an amplitude modulated signal that has a varying amplitude, comprising: first track and hold means for providing an output signal that tracks the amplitude of the amplitude modulated signal when in a tracking state, and switches to a hold state to provide a constant first output signal approximately equal to the amplitude of the amplitude modulated signal when said first track and hold means switches to said hold state;

second track and hold means for providing an output signal that tracks the amplitude of said constant first output signal when in a tracking state, and switching to a hold state to provide a second output signal approximately equal to said constant first output signal, said second track and hold means switches between said tracking and hold states at a phase that is different from when said first track and hold means switches between said tracking and hold states; and, control means for switching the states of said tracking and second track and hold means.

17. The apparatus as recited in claim 16, wherein said second track and hold means switches between said tracking and hold states 180° out of phase from when said first track and hold means switches between said tracking and hold states.

18. A method for demodulating an amplitude modulated signal that has a varying amplitude, comprising the steps of:

a) tracking the amplitude of the amplitude modulated signal to a peak amplitude with a first track and hold circuit;

b) providing a first constant output signal that corresponds to the peak amplitude of the amplitude modulated signal;

c) tracking said first constant output signal with a second track and hold circuit;

d) tracking the amplitude of the amplitude modulated signal with said first track and hold circuit while providing a second constant output signal with said second track and hold circuit that corresponds to said first constant output signal; and, e) repeating steps (a)–(d).

19. The method as recited in claim 18, wherein step (b) occurs 90° out of phase from step (a), step (c) occurs 90° out of phase from step (b), and step (d) occurs 90° out of phase from step (c).

* * * * *